(12) United States Patent
Dieu-Gomont et al.

(10) Patent No.: US 9,572,265 B2
(45) Date of Patent: Feb. 14, 2017

(54) METHOD OF PRODUCING AN ELECTRONIC CIRCUIT WITH PROTECTION OF THE CONDUCTIVE LAYER

(71) Applicant: Linxens Holding, Guyancourt (FR)

(72) Inventors: Séverine Dieu-Gomont, Limietz-Villez (FR); Francois Lechleiter, Favrieux (FR); Yannick De Maquillé, Sant-Germain-en-Laye (FR)

(73) Assignee: Linxens Holding, Guyancourt (FR)

( * ) Notice: Subject to any disclaimer, the term of this patent is extended or adjusted under 35 U.S.C. 154(b) by 0 days.

(21) Appl. No.: 14/406,544

(22) PCT Filed: Jun. 12, 2013

(86) PCT No.: PCT/EP2013/062091
§ 371 (c)(1),
(2) Date: Dec. 9, 2014

(87) PCT Pub. No.: WO2013/186241
PCT Pub. Date: Dec. 19, 2013

(65) Prior Publication Data
US 2015/0181723 A1  Jun. 25, 2015

(30) Foreign Application Priority Data

Jun. 14, 2012  (FR) .................................. 12 01701

(51) Int. Cl.
| H01L 21/302 | (2006.01) |
| H01L 21/461 | (2006.01) |
| H01B 13/00 | (2006.01) |
| C03C 15/00 | (2006.01) |
| C03C 25/68 | (2006.01) |
| H05K 3/32 | (2006.01) |
| H05K 3/00 | (2006.01) |
| H05K 1/18 | (2006.01) |

(Continued)

(52) U.S. Cl.
CPC ................ *H05K 3/32* (2013.01); *H05K 1/189* (2013.01); *H05K 3/002* (2013.01); *H05K 3/0017* (2013.01); *H05K 3/06* (2013.01); *H05K 3/4092* (2013.01); *H05K 2201/0397* (2013.01); *H05K 2201/10106* (2013.01); *Y10T 29/49133* (2015.01)

(58) Field of Classification Search
None
See application file for complete search history.

(56) References Cited

U.S. PATENT DOCUMENTS 3,480,836 A   11/1969  Aronstein ...................... 317/100
5,402,314 A * 3/1995  Amago ................. H05K 3/0094
                                              174/260

(Continued)

FOREIGN PATENT DOCUMENTS

WO   WO 03/026010 A1   3/2003

*Primary Examiner* — Stephanie Duclair
(74) *Attorney, Agent, or Firm* — Harrington & Smith

(57) ABSTRACT

The invention concerns a method of producing a circuit including the step consisting of connecting, to a bottom wall of a cavity, an electronic component with or without an intermediate wired link, the method including a step prior to an etching step which consists of depositing a layer of protective material on a conductive layer in the bottom of the cavity, said material being a liquid material capable of hardening and, once hardened, resistant to the etching solution.

15 Claims, 2 Drawing Sheets

(51) Int. Cl.
*H05K 3/06* (2006.01)
*H05K 3/40* (2006.01)

(56) References Cited

U.S. PATENT DOCUMENTS

| | | | |
|---|---|---|---|
| 5,433,819 A | 7/1995 | McMeen | 216/20 |
| 6,014,805 A | 1/2000 | Buixadera Ferrer | 29/852 |
| 6,461,953 B1 * | 10/2002 | Sakuyama | H01L 21/4853 438/106 |
| 2004/0256466 A1 * | 12/2004 | Droz | G06K 19/07749 235/492 |
| 2009/0031561 A1 * | 2/2009 | Huang | H05K 3/4092 29/830 |
| 2009/0266788 A1 | 10/2009 | Chang et al. | 216/17 |
| 2011/0039357 A1 * | 2/2011 | Lin | H01L 21/486 438/26 |

\* cited by examiner

METHOD OF PRODUCING AN ELECTRONIC CIRCUIT WITH PROTECTION OF THE CONDUCTIVE LAYER

The invention relates to the production of electronic circuits particularly printed circuits.

In particular it relates to the production of such circuits when they bear one or more components which have contacts on one face intended to be positioned facing the circuit conductor tracks for making contact with such tracks without an intermediate wire connection, these components also being called 'flip chips' in English terminology.

The invention also relates to the production of electronic circuits particularly printed circuits, bearing one or more components which have contacts on one face and where these contacts are intended to be electrically connected to circuit conductor tracks for making contact with such tracks via respective intermediate wire connections extending from the contact up to the conductor track, or components of the wire bonding type according to English terminology.

The invention relates in particular to the production of such electronic circuits of the flexible type.

The invention relates in particular to the production of such circuits when the components are light emitting components such as electroluminescent diodes—or LEDs—Light Emitting Diodes in English. For producing such a circuit, it is possible to provide a support consisting in particular of a dielectric film and a copper foil laminated together. The dielectric film is pre-perforated before lamination for comprising a plurality of windows each intended to receive one or more components such that the component or components are placed at the bottom of a cavity defined by the window of the dielectric film.

For producing such a circuit, it is further necessary to arrange grooves in the copper layer and in particular in a portion of the copper layer forming the bottom of the cavity. The role of such grooves is particularly that of electrically separating different segments of the bottom of the cavity, such as one segment connected to a contact forming the anode of the component and one segment connected to a contact forming the cathode of the component. Such grooves at the cavity bottom also serve to define the electrical tracks connecting various members of the circuit such as the component placed in the cavity or other components of the circuit.

An object of the invention is to provide a method of producing such an electronic circuit, particularly a flexible one, which can be used to produce such grooves in a step subsequent to the lamination of the conductive layer with the dielectric film, and wherein the step of producing grooves does not cause any damage to a face of the conductive layer situated at the bottom of the cavity so that the component can be attached and reliably connected on this face.

This aim is achieved according to the invention thanks to a method for producing a circuit including a support which support includes a conductive layer and a dielectric film laminated together, the method including a step of making windows in the dielectric film so that the support forms cavities having a bottom wall formed by the conductive layer and borders formed by the dielectric film, the method including the step consisting of an electronic component being placed against the bottom wall of a cavity and being connected to the bottom wall, and the method including the step consisting of etching grooves in the conductive layer, the method being characterized in that the step of etching the conductive layer is performed after the lamination of the conductive layer with the dielectric film with the aid of an etching solution and the method includes a preliminary step to the step of etching, which preliminary step consists of depositing a layer of protective material on the conductive layer in the bottom of the cavity and on at least one part of the dielectric film forming the borders of the cavity, which protective material is a liquid material capable of hardening and once hardened resistant to the etching solution used in the step of etching the conductive layer.

Advantageously, the step consisting of an electronic component being placed against the bottom wall of a cavity and the electronic component being connected to the bottom wall includes connecting the electronic component with the bottom wall without an intermediate wire connection.

Advantageously, the step consisting of an electronic component being placed against the bottom wall of a cavity and the electronic component being connected to the bottom wall includes connecting the electronic component to the bottom wall via a wire connection which extends from the electronic component to the bottom wall.

Advantageously, the electronic component is an electroluminescent component.

Advantageously, the protective material is an ink.

Advantageously, the protective material is a resin.

Advantageously, the protective material is a mixture of at least one ink and at least one resin.

Advantageously, the protective material forms part of the group consisting of mono or bi-component polyurethanes, acrylic or methacrylic resins, ultraviolet crosslinkable acrylic resins, styrene-maleic anhydride copolymers, styrene-acrylic copolymers, methacrylic-acrylic copolymers, phenol formaldehyde resins, novolac resins, and epoxy resins.

Advantageously, the protective material is a material capable of being hardened by exposure to light and the method includes the step consisting of exposing the protective material to light to harden it.

Advantageously, the method includes a step subsequent to the step of etching which consists of removing the layer of protective material.

Advantageously, the step consisting of removing the layer of protective material consists of immersing the support in a bath of chemical solution for etching the layer of protective material.

Advantageously, the protective material is applied by an operation forming part of the group consisting of spraying, coating and printing.

Advantageously, the circuit is a flexible type of circuit.

Other features, aims and advantages of the invention will become apparent upon reading the following description, with reference to the accompanying figures in which.

Figure 1:
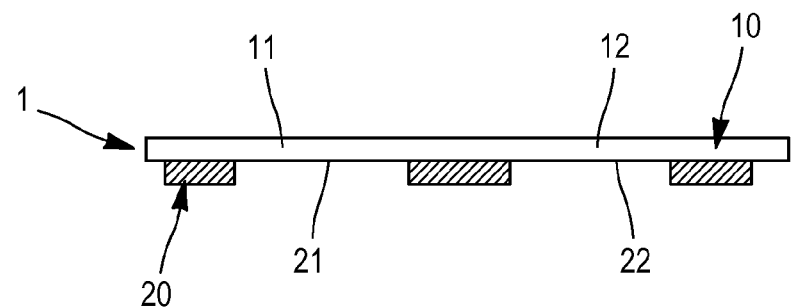
FIG. 1 shows a support according to one embodiment of the invention in a first step of production.

As shown in FIG. 1, an electronic circuit support 1 consists here of a copper foil 10 and a dielectric film 20 laminated together. The dielectric film 20 and the copper foil are of sufficiently small thickness for the support 1 to be of the flexible type. In particular, the dielectric film 20 and the copper foil before lamination are in the form of rolls and a description will now be given of various processing steps which will preferably be performed by unwinding and winding a roll of such a foil, film or support, thus enabling a particularly high speed of implementation of the method which will now be described.

The dielectric film 20 here is a film of epoxy glass, which has been subjected to a step of gluing onto an upper face then a step of perforation before being laminated with the copper layer 10. The perforations here form two windows 21, 22 in the film 20 for each receiving a component which will be described later and which in the present example will be a luminescent component. The windows, here shown two in number for the sake of descriptive simplicity, are preferentially distributed homogeneously for an equally homogeneous distribution of light emitted by the luminescent components.

In the embodiment now described, the luminescent component is a bare chip type semiconductor in English.

Such a bare chip is also called a 'die' in English, by virtue of the industrial method typically used for obtaining such a bare chip. One such method consists of producing substantial batches of a same integrated circuit consisting of diffusion trace elements having a chosen configuration on a surface of a substrate or 'wafer' in English. The wafer is then cut into small pieces each forming a copy of the circuit. Each of these pieces thus constitutes a 'die' in English. The bare chip consists of a substrate on which is deposited a sequence of semiconductor layers, which sequence of semiconductor layers has the ability to emit light when a potential difference is applied between two specific layers of this sequence of layers. Such a bare chip typically has a width of a few tens of micrometers and such a bare chip has contact segments with a width of a few tens of micrometers, typically between 50 and 100 micrometers.

The present bare chip here is a 'flip chip' according to English terminology, which comprises contact segments on one face of the chip intended to be positioned facing circuit tracks so that the chip is brought into connection with these conductor tracks without an intermediate wire connection, typically by means of a solder paste.

In another embodiment, the bare chip is connected to the circuit tracks via wire connections which extend each time from one contact of the chip up to a corresponding track of the circuit, according to the technology known as 'wire bonding' in English terminology, the wire connections being, for example, soldered to the circuit tracks.

In another embodiment, the luminescent component is a Surface Mount Component or SMC, according to the English term.

Surface Mount Technology in English, known under the acronym SMT, is a method for constructing electronic circuits in which the Surface Mounted Components—usually referred to as SMCs in English—are mounted directly on the surface of a circuit. An electronic device thus produced is called a Surface Mounted Device or SMD in English.

An SMC comprises a substrate and a bare chip similar to that described above. The bare chip is attached to a first face of the substrate, the substrate comprising conductive segments on a second face of the substrate. The conductive segments of the bare chip are connected to the conductive segments of the substrate by means of wire connections. An encapsulation body is overmoulded onto the bare chip and onto the wire connections so that the SMC forms a protected and robust component that can be easily and directly mounted on a support provided with conductor tracks. An SMC has a typical size of the order of half a millimeter. The conductive segments of an SMC have a size typically of the order of a few hundred micrometers. Such an SMC is used here which may be a flip chip or 'puce basculée' in French, so that the SMC is positioned in a window 21, 22 with its contact segments placed facing conductor tracks formed by the copper layer 10 and connected thereto without an intermediate wire connection.

In a variant, the SMC is placed in the cavity and connected to the conductor tracks formed by the copper layer 10 by means of wire connections. In this case, the SMC is advantageously placed so that its contacts are pointing in a direction away from the copper layer 10. The wire connections are advantageously soldered both to the contacts of the SMC and to the conductor tracks formed by the copper layer 10.

In order to create such tracks in the copper layer, grooves are made therein, the support 1 then forming the printed part of the printed circuit to be produced. Thus and for the purposes of simplicity of representation, a groove is made here in each cavity 21, 22 which groove is intended to constitute an electrical separation in the copper layer 10 between a portion coming into contact with an anode of the component and a portion coming into contact with a cathode of the component.

Such grooves are produced here by chemical etching of the copper layer, here with the aid of a chemical etching reagent known in itself based on cupric chloride and including hydrochloric acid.

Each cavity 21, 22 has a respective bottom wall 11, 12 formed by a portion of the copper layer 10 which is not supported by any substrate, which copper layer portion forming the bottom wall is therefore bare on both faces thereof and exposed in this state to the attack of the chemical etching solution.

Before being immersed in a bath of such an etching reagent, the copper layer 10 will be protected on its face on the side opposite that bearing the dielectric film 20, in the areas thereof complementary to those having to be etched. Such protection will be achieved by deposition, exposure, development then cleaning of a photosensitive protective film.

However, such a technique of making grooves certainly protects one face of the copper layer 10 which is oriented away from the dielectric film 20, but does not protect the face of the copper layer positioned towards the dielectric film 10 and in particular does not protect the portions of the copper layer 10 forming the bottoms of the cavities 21 and 22.

Protecting this face of the support by depositing a conventional photosensitive film could certainly be envisaged, but such a technique would be inappropriate in this sort of configuration. First, known photosensitive films only enable low and therefore unreliable adhesion on the material forming the dielectric layer 20. Then a space would remain between the dielectric film and the bottom 11, 12 of each cavity 21, 22, into which the etching solution might penetrate after the solution has hollowed out the groove over the entire thickness of the copper layer, the solution coming to damage the face of the copper layer forming the bottom of the cavity, which face must remain intact and level for receiving the component.

The face of the copper layer 10 forming the bottom of the cavities 21, 22 is protected here according to the following technique, which will now be described with reference to FIG. 2.

In a step of protection shown in FIG. 2, a liquid layer 30 is deposited on the face of the support 1 forming the cavities 21, 22, the layer consisting here of a hardenable ink which, once hardened, is resistant to the etching reagent subsequently used for etching the grooves.

Such an etching resistant or 'etch resist' ink in English has the advantage, due to its liquid form, of more readily fitting to any shape of wall and thus filling the cavities to be protected here.

Such an 'etch resist' ink may or may not be a photosensitive ink.

The ink used is preferably removable or 'strippable' in English by using a special etching or 'stripping' solution in English acting on such an ink. The ink used is thus preferably 'strippable' in an alkaline or solvent based medium.

Various techniques can be used for applying the liquid ink, such as coating e.g. by roller, curtain, or with the aid of a nozzle of the slot printing or 'slot die' type in English terminology.

The ink may be applied by printing, e.g. by an application by screen printing, ink jet, or by 'offset' technique in English terminology, etc. The method of applying the ink is selected according to the characteristics and viscosity of the ink used.

As a variant the protective material applied in liquid form and resistant to chemical etching once hardened may be a resin, or an ink and resin mixture. Such a protective layer may thus be selected for being hardenable by exposure to light or not.

Suitable chemical families are the mono or bi-component polyurethanes, acrylic or methacrylic resins which may be hydroxylated or carboxylated, ultraviolet crosslinkable acrylic resins, styrene-maleic anhydride copolymers, styrene-acrylic copolymers, methacrylic-acrylic copolymers, phenol formol resins, novolac resins or phenol formaldehyde resin, etc.

Such inks or resins are commercially available for example under the references and brands of APR-68 from Atotech, Probimage 120 from Huntsman, the XV750 Imageline Etch Resist Family from Coates, Photoposit SN68H, SP 24 from Rohm and Haas, AS500-LY from Taiyo Ink, ETP 240RC, ETAV 24 from Electra Polymers Ltd., ELPEMER RC2054 HR from Peters, SMA1440F resin from Arkema, Joncryl 678 from BASF, Alnovol PN 160 from Cytec, etc.

Stripping may be performed with an aqueous alkaline solution, e.g. a 2% sodium or potassium hydroxide solution or a solvent of the family of ketones, esters or alcohols such as acetone, methyl ethyl ketone, ethyl acetate, ethanol, etc.

Figure 3:
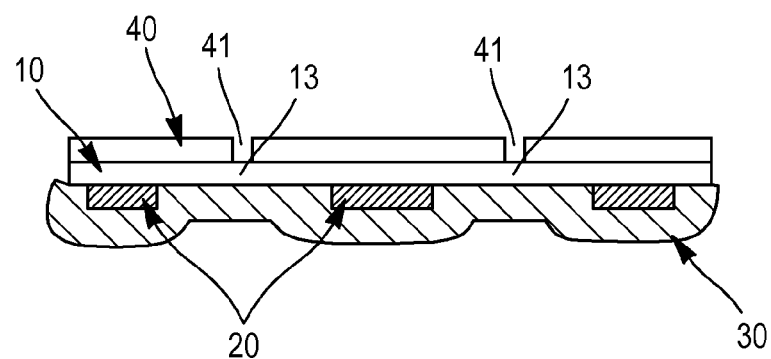
FIG. 3 shows the same support after a photo-imaged protective film is put in place against chemical etching.

As shown in FIG. 3, a protective layer 40 is then positioned on the face of the copper layer 10 which is arranged opposite the dielectric layer 20, according to a technique known in itself of depositing photosensitive film or photosensitive lacquer, exposure of this film or this lacquer according to a desired topography, development then chemical removal of the unexposed areas.

In the end the protective film 40 has the configuration shown in FIG. 3, where it has openings 41 that expose the areas 13 of the copper layer 10 on the face opposite that bearing the dielectric layer 20.

Etching is then performed by immersing this assembly in the bath of etching solution. The solution then enters the openings 41 of the protective film 40 and hollows out a groove 14 in the copper layer 10, here in the central position of the cavities 21, 22.

The etching solution goes through the copper layer 10 and then reaches the layer of protective material 30, where it is stopped so that it cannot reach the opposite face of the copper layer 10 forming the bottom of the cavity considered 21, 22.

The face of the copper layer 10 forming the bottom of the cavity 21, 22 is thus protected from any alteration by the etching solution and remains intact for positioning, attaching and placing the component in contact.

A following step consists of the removal of the photo-imaged protective film 40 and the layer of protective material 30, by immersion in stripping baths appropriate to each of the materials forming these layers 30 and 40.

Figure 4:
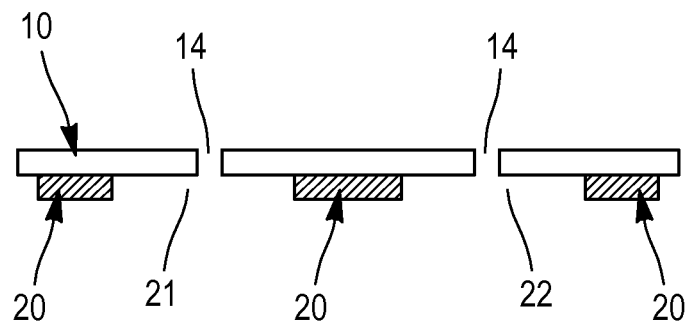
FIG. 4 shows the same support after making grooves in a conductive layer of this support.
Figure 5:
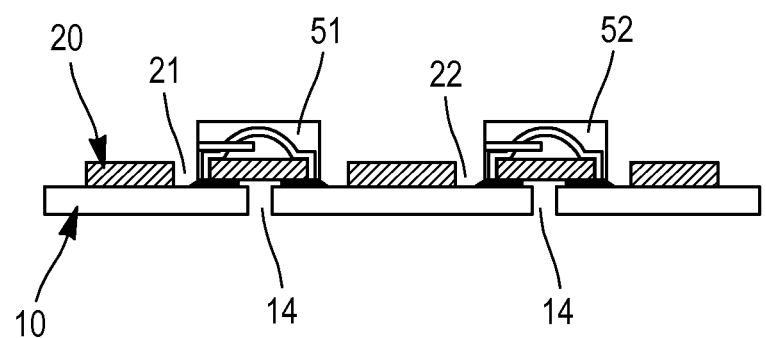
FIG. 5 shows the same support after a luminescent component is put in place thereon.

The assembly obtained, shown in FIG. 4, then consists of a support having a series of cavities 21, 22 each provided with a central groove 14 separating two respective contact segments of the bottom of the cavity considered.

Obviously, multiple layouts of bottom of cavity grooves may be considered, such as straight lines, curves, T-shaped, S-shaped layouts, etc.

Figure 2:
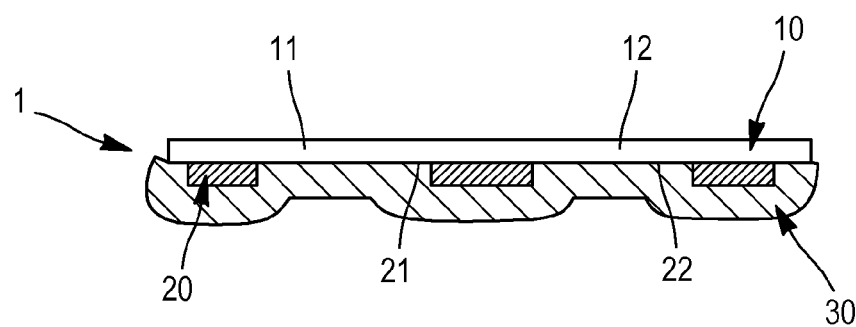
FIG. 2 shows the same support after deposition of a layer of protective material.

As shown in FIG. 2, the protective material 30 fits the bottom of the cavity formed by the copper layer 10 and the edges of the cavity formed by the edges of the windows of the dielectric film 20. The protective material 30 will in particular adhere to the copper layer in an area of the bottom of the cavity 21, 22 where the groove must be made. Thus, the use of liquid 'etch resist' material for protecting the bottom of the cavity makes this technology very flexible and adaptable to many product configurations.

Although in the present example the cavities have a width of between 650 µm and 2.8 mm, the method is adaptable to much larger or much smaller cavities. The method is also adaptable to variations in the shape of the cavities to be protected such as square, rectangular, circular shapes, as well as to variations in the number and/or density of the cavities to be protected and therefore to varied spaces between the cavities. In the present embodiment, the space between adjacent cavities is, for example, between 1.5 mm and 9.5 mm, corresponding to a number of cavities ranging from 6 to 18 cavities for a width having a value of 70 mm.

The method is also adapted to variations in the thickness of the dielectric film 20 and therefore in the depth of the cavities 21, 22 to be filled. In the present example, the cavities 21, 22 have a thickness of 200 µm. The method is also adapted to variations in the thickness of the copper layer 10 to be protected and therefore to the parameters used in etching, the copper layer being capable of being, for example, a 35 or 70 µm thick copper foil. The method is also adapted to variations in the shape of the groove or here the inter-track to be etched, this groove being capable of being, for example, in a straight line, S-shaped, T-shaped or any other line shape.

One of the main difficulties lies in the possibility of ensuring the bubble-free filling of cavities with the etching resistant ink. Indeed, if bubbles are present, the role of temporary protection for etching may not be fully ensured since the deposit of ink offers less mechanical resistance to the etching bath jet at the level of the bubbles.

The assembly obtained is then subjected to an operation of depositing a finish layer on the face of the support 1 where the dielectric layer 20 is located. A metal finish layer thus covers both the copper layer 10 in the bottom of the cavities 21, 22 and the dielectric layer 20 in the exposed parts thereof, i.e. both in the areas thereof extending in the main plane of the support 1 and the areas thereof forming the vertical borders of the cavities 21, 22. The finish layer consists of a layer of a noble metal with a metal such as nickel or gold, silver, palladium etc. or an alloy of one or more of these metals, or a sequence of layers of one or more of these metals as required. This finish layer protects the support from mechanical stress, oxidation, and provides a reflective effect favourable to the lighting effect generated by the assembly. Such final metallization is flexible: the metallization may be achieved electrolytically or without the use of a deposition electrode using a technique also called 'electroless' in English terminology.

In addition, it is advantageous to deposit a material on the face of the copper layer 10 which is opposite to that bearing the dielectric film 20 such as a solder masking material or soldermask or coverlay in English, and which advantageously at least partially penetrates into the grooves 14 made, for preventing a solder paste or a resin for encapsulation of the electroluminescent component from spreading through the groove in areas not covered by the component during the assembly of this component with the support. The soldermask type material is preferably a laminated material on the face of the copper layer 10 which is opposite that bearing the dielectric film 20 such that it causes at least partial penetration of this material into the grooves 14 made. The material is preferably a material that is capable of being exposed, developed and thermally crosslinked for the easy and precise application thereof.

In a final step, the components 51, 52 are positioned within the cavities 21, 22, by being attached and placed in contact with the bottom of each cavity which is formed by the copper layer 10, here by means of a conductive solder paste arranged under the contact segments of these components 51, 52 or for example by gold wires.

Although described with reference to the installation of electroluminescent components, the invention is suited to the production of circuits bearing semiconductor-based components which do not have a luminescent function but fulfil other functions such as, for example, electrical and/or data processing functions.

The invention claimed is:

1. Method for producing a circuit including a support which support includes a conductive layer and a dielectric film laminated together, the method including a step of gluing onto an upper face of the dielectric film and a subsequent step of perforating the dielectric film before being laminated with the conductive layer for form windows in the dielectric film so that the support forms at least one cavity having a bottom wall formed by the conductive layer and borders formed by the dielectric film, the method including the step consisting of an electronic component being placed against the bottom wall of said at least one cavity and being connected to the bottom wall, and the method including the step consisting of etching grooves in the conductive layer, wherein the step of etching the conductive layer is performed after the lamination of the conductive layer with the dielectric film with the aid of an etching solution and the method includes a preliminary step to the step of etching, which preliminary step consists of depositing a layer of protective material on the conductive layer in the bottom of said at least one cavity and on at least one part of the dielectric film forming the borders of said at least one cavity, which protective material is a liquid material capable of hardening and once hardened resistant to the etching solution used in the step of etching the conductive layer.

2. Method according to claim 1, characterized in that the step consisting of an electronic component being placed against the bottom wall of said at least one cavity and the electronic component being connected to the bottom wall includes connecting the electronic component with the bottom wall without an intermediate wired connection.

3. Method according to claim 1, characterized in that the step consisting of an electronic component being placed against the bottom wall of said at least one cavity and the electronic component being connected to the bottom wall includes connecting the electronic component to the bottom wall via a wire connection which extends from the electronic component to the bottom wall.

4. Method according to claim 1, characterized in that the electronic component is an electroluminescent component.

5. Method according to claim 4, including a step of depositing a finish layer on the face of the support where the dielectric layer is located, extending in the main plane of the support and the areas thereof forming the vertical borders of the cavities, providing a reflective effect favourable to a lighting effect generated by the assembly.

6. Method according to claim 1, characterized in that the protective material is an ink.

7. Method according to claim 1, characterized in that the protective material is a resin.

8. Method according to claim 1, characterized in that the protective material is a mixture of at least one ink and at least one resin.

9. Method according to claim 1, characterized in that the protective material forms part of the group consisting of mono or bi-component polyurethanes, acrylic or methacrylic resins, ultraviolet crosslinkable acrylic resins, styrene-maleic anhydride copolymers, styrene-acrylic copolymers, methacrylic-acrylic copolymers, phenol formaldehyde resins, novolac resins and epoxy resins.

10. Method according to claim 1, characterized in that the protective material is a material capable of being hardened by exposure to light and the method includes the step consisting of exposing the protective material to light to harden it.

11. Method according to claim 1, characterized in that it includes a step subsequent to the step of etching which consists of removing the layer of protective material.

12. Method according to claim 11, characterized in that the step consisting of removing the layer of protective material consists of immersing the support in a bath of chemical solution for etching the layer of protective material.

13. Method according to claim 1, characterized in that the protective material is applied by an operation forming part of the group consisting of spraying, coating and printing.

14. Method according to claim 1, characterized in that the circuit is a flexible type of circuit.

15. Method according to claim 1, wherein the support consists of a conductive layer and a dielectric film laminated together.

* * * * *

UNITED STATES PATENT AND TRADEMARK OFFICE
CERTIFICATE OF CORRECTION

| | | |
|---|---|---|
| PATENT NO. | : 9,572,265 B2 | Page 1 of 1 |
| APPLICATION NO. | : 14/406544 | |
| DATED | : February 14, 2017 | |
| INVENTOR(S) | : Dieu-Gomont et al. | |

It is certified that error appears in the above-identified patent and that said Letters Patent is hereby corrected as shown below:

In the Claims

Claim 1, Column 7, Line 39 "form" should be deleted and --forming-- should be inserted.

Signed and Sealed this
Eleventh Day of April, 2017

Michelle K. Lee
*Director of the United States Patent and Trademark Office*